United States Patent
Kong et al.

(10) Patent No.: US 9,077,349 B2
(45) Date of Patent: Jul. 7, 2015

(54) AUTOMATIC DETECTION AND COMPENSATION OF FREQUENCY OFFSET IN POINT-TO-POINT COMMUNICATION

(75) Inventors: Xiaohua Kong, San Diego, CA (US); Zhi Zhu, San Diego, CA (US); Nam V. Dang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 154 days.

(21) Appl. No.: 13/401,020

(22) Filed: Feb. 21, 2012

(65) Prior Publication Data

US 2013/0216014 A1 Aug. 22, 2013

(51) Int. Cl.
*H03D 3/24* (2006.01)
*H03L 7/07* (2006.01)

(52) U.S. Cl.
CPC .......................................... *H03L 7/07* (2013.01)

(58) Field of Classification Search
CPC ....... H03L 7/0807; H03L 7/091; H04L 7/033; H04L 7/0025
USPC .............. 375/354, 371, 373, 376, 375; 331/2; 327/147, 156; 713/500
See application file for complete search history.

(56) References Cited

U.S. PATENT DOCUMENTS

| | | | | |
|---|---|---|---|---|
| 7,522,686 | B2* | 4/2009 | Nam et al. | 375/355 |
| 7,542,533 | B2* | 6/2009 | Jasa et al. | 375/354 |
| 2006/0056564 | A1* | 3/2006 | Takeuchi | 375/376 |
| 2006/0083343 | A1* | 4/2006 | Roederer et al. | 375/375 |
| 2006/0115035 | A1 | 6/2006 | Yu et al. | |
| 2006/0140309 | A1* | 6/2006 | Kuo et al. | 375/326 |
| 2008/0253494 | A1* | 10/2008 | Aoyama | 375/376 |
| 2008/0260087 | A1* | 10/2008 | Liang et al. | 375/376 |
| 2009/0060107 | A1* | 3/2009 | Fischer et al. | 375/355 |
| 2011/0075781 | A1* | 3/2011 | Kenney | 375/376 |
| 2012/0049910 | A1* | 3/2012 | Aoyama | 327/156 |

FOREIGN PATENT DOCUMENTS

| | | |
|---|---|---|
| EP | 0663744 A1 | 7/1995 |
| WO | 2006104808 A1 | 10/2006 |

OTHER PUBLICATIONS

M. Banu and A. Dunlop "A 660 Mb/s CMOS clock recovery circuit with instantaneous locking for NRZ data and burst-mode transmission", Proc. IEEE Int. Solid-State Circuits Conf. (SSCC), pp. 102-103 1993.*

(Continued)

*Primary Examiner* — Daniel Washburn
*Assistant Examiner* — Amneet Singh
(74) *Attorney, Agent, or Firm* — Donald D. Min

(57) ABSTRACT

Systems and methods for automatic detection and compensation of frequency offset in point-to-point communication. A burst mode clock and data recovery (CDR) system comprises input data received at a first frequency and a reference clock operating at a second frequency. A master phase-locked loop (PLL) comprising a first gated voltage controlled oscillator (GVCO) is configured to align the phases of reference clock and the input data, and provide phase error information and a recovered clock. A second GVCO is controlled by the recovered clock to sample the input data. A frequency alignment loop comprising a feedback path from the second GVCO to the master PLL is configured to use the phase error information to correct a frequency offset between the first frequency and the second frequency.

20 Claims, 8 Drawing Sheets

BURST MODE CDR WITH
FREQUENCY COMPENSATION LOOP

(56) References Cited

OTHER PUBLICATIONS

H. L. Chu, C. L. Hsieh, and S. I. Liu, "20 Gb/s ¼-rate and 40Gb/s ⅛-rate burst-mode CDR circuits in 0.13μm CMOS," IEEE Asian Solid-State Circuits Conference (A-SSCC), pp. 429-433, Oct. 2008.*

C.-F. Liang and S.-C. Hwu "A 10 Gbps burs-mode CDR circuit in 0.18 um CMOS", Proc. IEEE Custom Integrated Circuits Conf. (CICC), pp. 228-229 2006.*

J. Terada and K. Nishimura "A 10.3125-Gbit/s SiGe BiCMOS burst-mode clock and data recovery circuit with 160-bit consecutive identical digit tolerance", Proc. Eur. Conf. Optical Commun. (ECOC), 2007.*

C.-F. Liang and S.-I. Liu "A 20/10/5/2.5 Gb/s power-scaling burst-mode CDR circuit using GVCO/Div2/DFF tri-mode cells", Proc. IEEE Int. Solid-State Circuits Conf. (ISSCC), 2008.*

M. Banu and A. Dunlop "A 660 Mb/s CMOS clock recovery circuit with instantaneous locking for NRZ data and burst-mode transmission", Proc. IEEE Int. Solid-State Circuits Conf. (ISSCC), pp. 102-103 1993.*

K. Nishimura and M. Nogawa "A 10 Gb/s burst-mode CDR IC in 0.13 um CMOS", Proc. IEEE Int. Solid-State Circuits Conf. (ISSCC), pp. 228-229 2005.*

"International Search Report" for International Application No. PCT/US2013/026923 mailed on Sep. 13, 2013.*

International Search Report and Written Opinion—PCT/US2013/026923—ISA/EPO—Sep. 13, 2013.

Partial International Search Report—PCT/US2013/026923—ISA/EPO—Jun. 17, 2013.

Safwat S., et al., "A Design Methodology for al Low Power bang-bang all Digital PLL based on Digital Loop Filter Programmable Coefficients", Energy Aware Computing (ICFAC), 2011 International Conference on, IEEE, Nov. 30, 2011, pp. 1-4, XP032099524.

Savoj, J., et al., "Clock and data recovery architectures", High-Speed CMOS Circuits for Optical Receivers, XX, XX, Jan. 1, 2001, pp. 21-93, XP002306705.

* cited by examiner

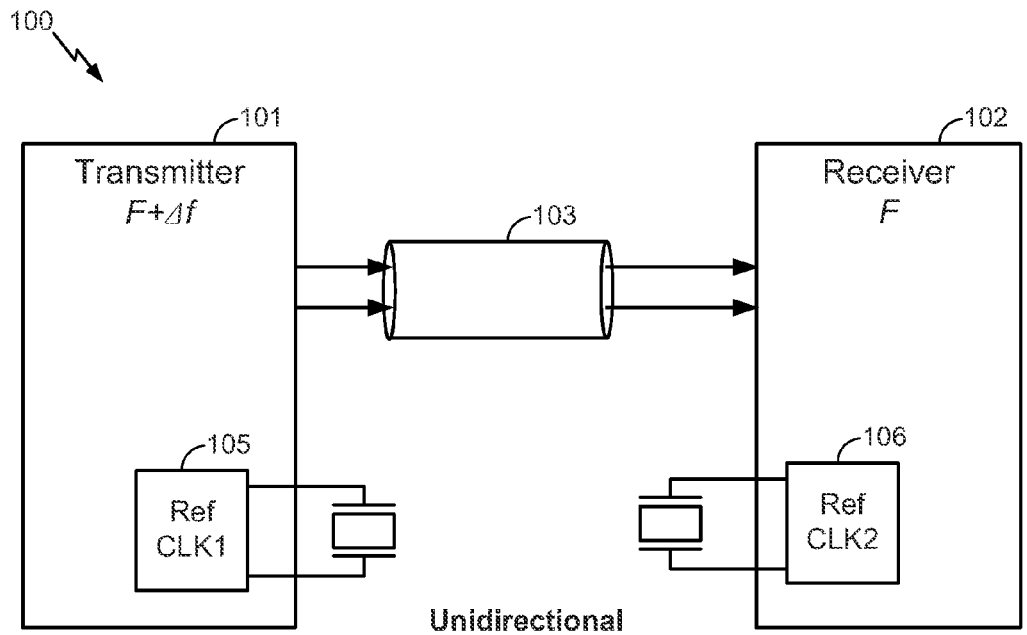
FIG. 1A
CONVENTIONAL
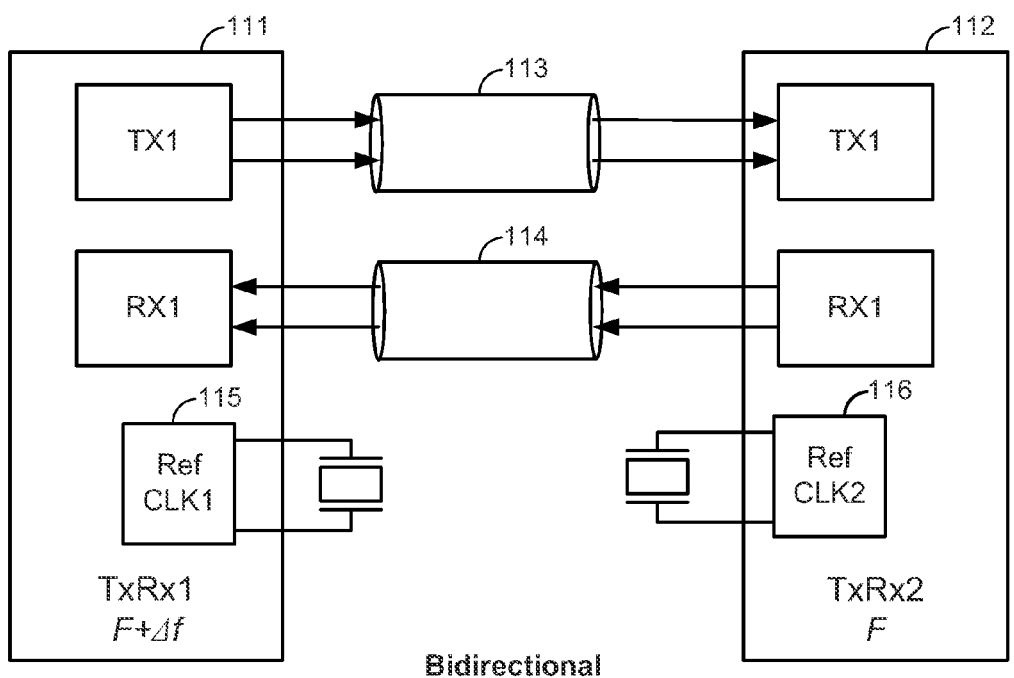
FIG. 1B
CONVENTIONAL

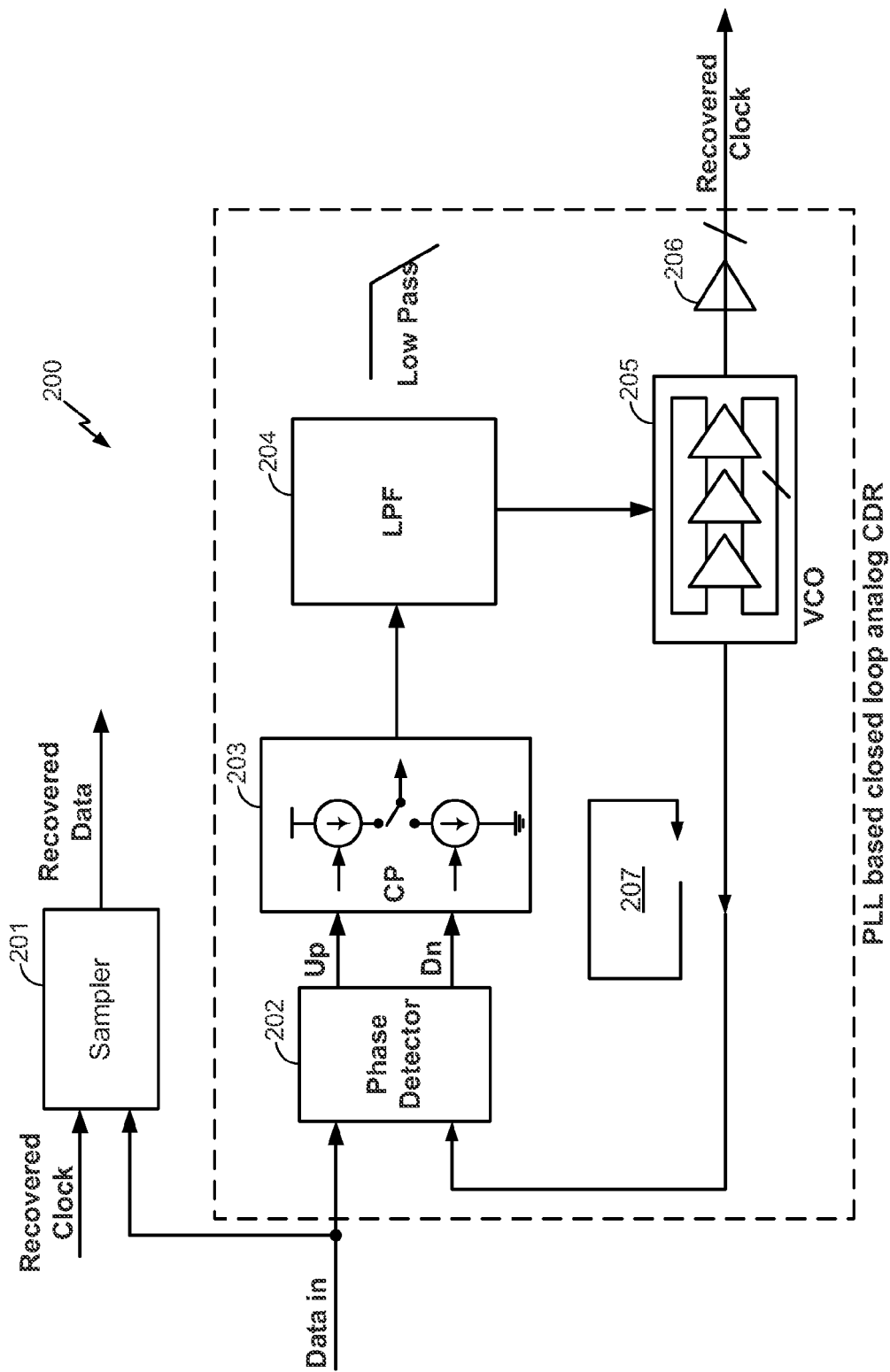
FIG. 2A
CONVENTIONAL
PLL based closed loop analog CDR

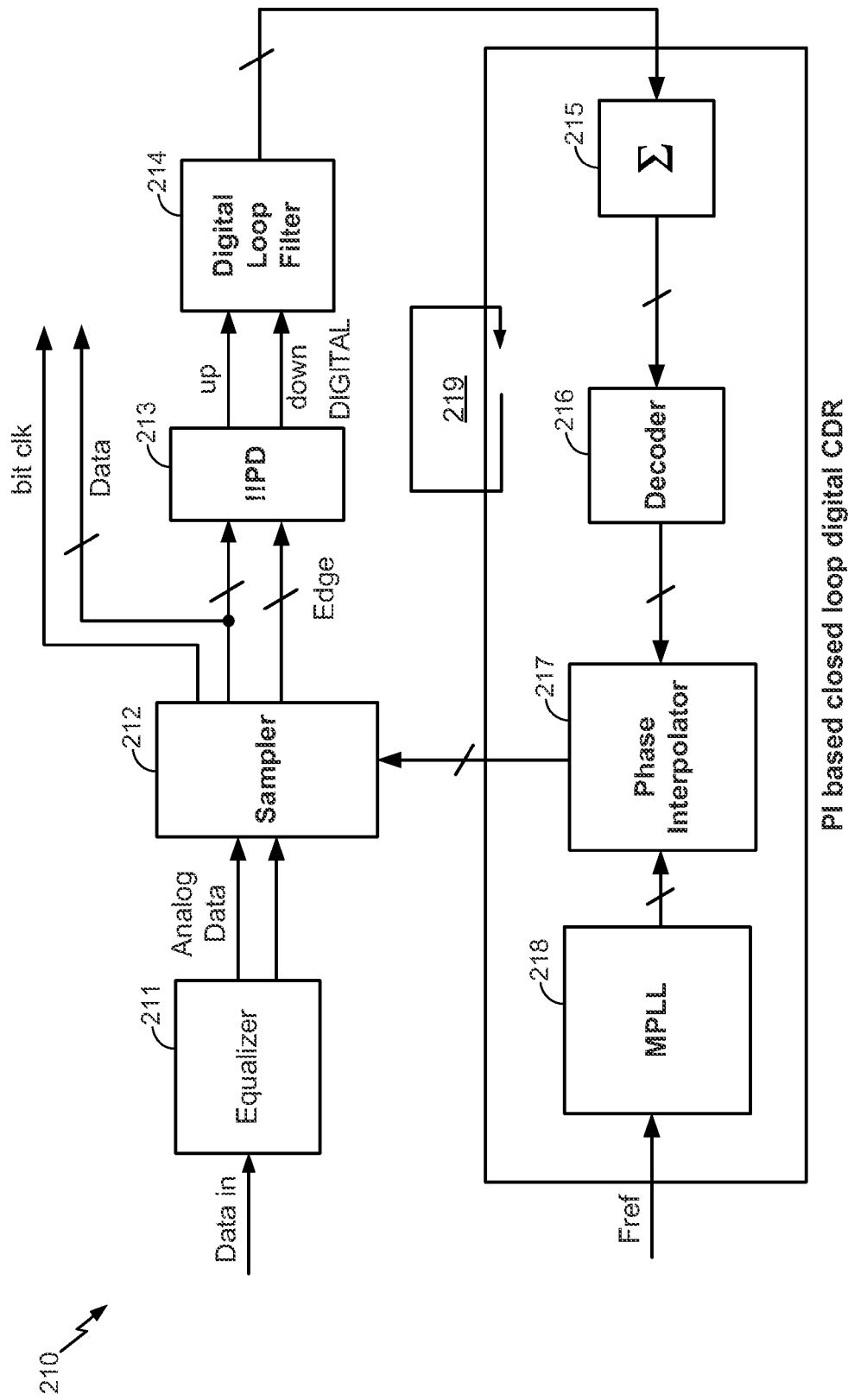
FIG. 2B
CONVENTIONAL

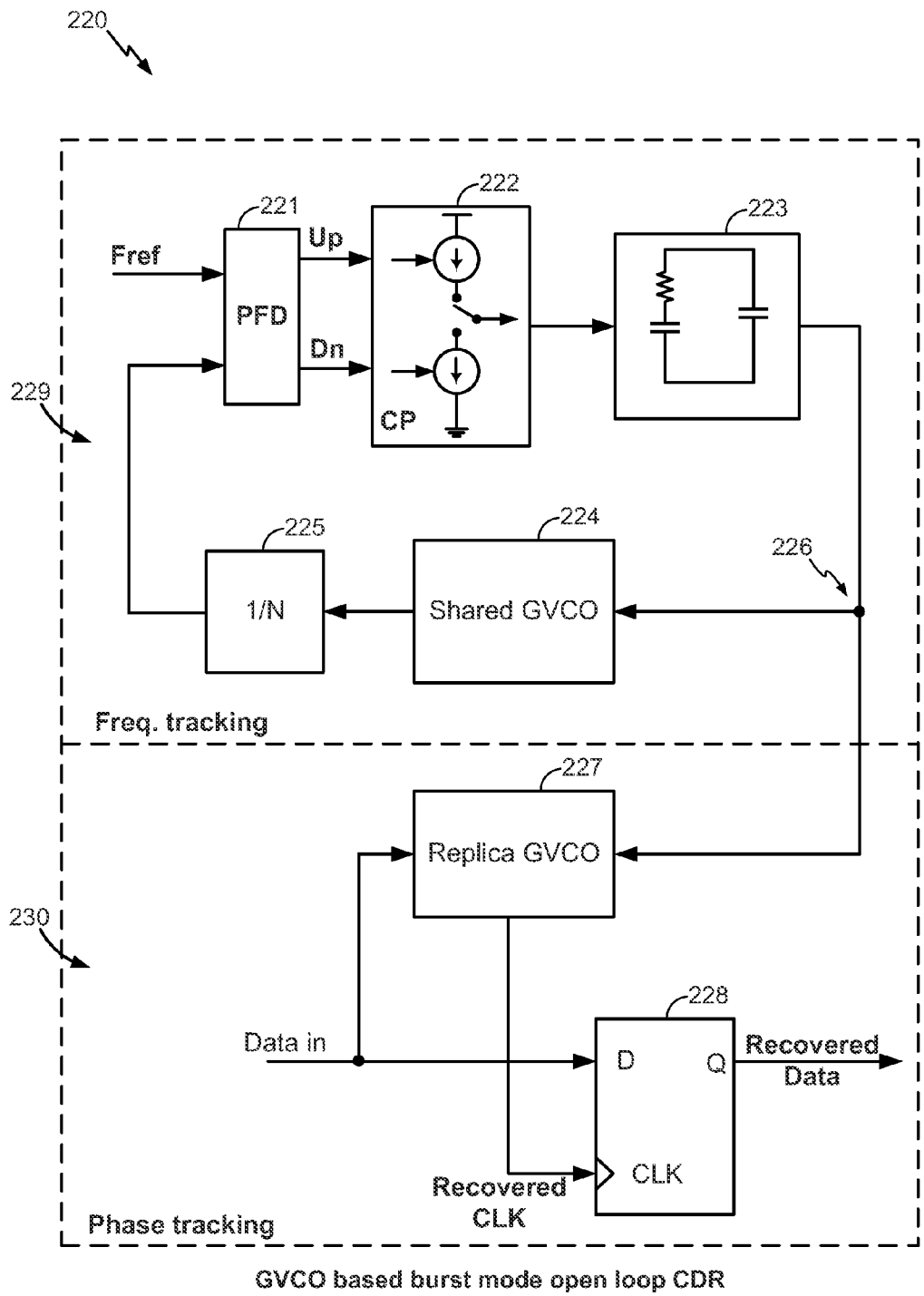
FIG. 2C
CONVENTIONAL

BURST MODE CDR WITH FREQUENCY COMPENSATION LOOP

*FIG. 4* PI BASED DIGITAL CDR WITH FREQUENCY COMPENSATION LOOP

US 9,077,349 B2

AUTOMATIC DETECTION AND COMPENSATION OF FREQUENCY OFFSET IN POINT-TO-POINT COMMUNICATION

FIELD OF DISCLOSURE

Disclosed, embodiments relate to clock recovery and, synchronization in point-to-point communication. More particularly, exemplary embodiments are directed to detecting frequency offsets between clocks at transmitter and receiver ends as well as frequency offsets within transmitter/receiver systems and automatically compensating for the frequency offsets.

BACKGROUND

In general, point-to-point data communication will require the clock/data frequency to be synchronized between transmitter and receiver ends. For example, with reference to FIG. 1A, a unidirectional transmitter-receiver system 100 is illustrated with transmitter 101 and receiver 102. Data is transmitted in channel 103. Transmitter 101 operates at a frequency derived from reference clock 105, while receiver 102 operates at a frequency derived from reference clock 106. While in an ideal case scenario, both reference clocks 105 and 106 would oscillate at the same frequency F, this ideal case scenario is seldom achievable because of process variations which are inherent in design and manufacture of system 100. Accordingly, reference clock 105 may operate at a reference frequency $F+\Delta F$ at which data 103 is transmitted, while reference clock 106 at the receiver end may operate at a reference frequency F, wherein $\Delta F$ may be either a positive or negative value. This variation or offset $\Delta F$ will prevent data 103 received at receiver 102 to be perfectly synchronized at the receiver end. In high speed data communication even a minor value of $\Delta F$ may lead to a high bit error rate which may be unacceptable.

The above problem is also seen in bidirectional communication employing transceivers 111 and 112 as illustrated in system 110 of FIG. 1B. As shown, reference clock 115 at transceiver 111 (comprising transmitter TX1 and receiver RX1) may operate at a frequency $F+\Delta F$ while reference clock 116 at transceiver 112 (comprising transmitter TX2 and receiver RX2) may operate at a frequency F. Thus data 113 communicated from transceiver 111 to 112 as well as data 114 communicated transceiver 112 to 111 will suffer from imperfect synchronization.

In both systems 100 and 110, because separate clocks are used as reference clocks at the two ends of data communication, known techniques for synchronization, such as data transmission with embedded clocks, are inefficient and incur expensive design costs because of the frequency offset $\Delta F$. Moreover, the above noted reference clocks are prone to frequency drifts caused by aging, temperature variation, etc, which may further exacerbate the frequency offset. The frequency offset may further degrade system performance and bit error rate by reducing a tolerance margin for clock jitter. Thus, the frequency offset may result in a significant degradation of quality and cost associated with data transmission and reception.

Turning now to FIGS. 2A-C conventional techniques for combating the effects of the frequency offset are illustrated, and their shortcomings will be discussed with reference thereto. Firstly, FIG. 2A illustrates a phase-locked loop (PLL) based closed loop analog clock and data recovery (CDR) system 200. System 200 may be integrated at a receiver end such as receiver 102 of system 100 or in transceivers 111 and 112 of system 110 in order to synchronize received data such as 103, 113 or 114 with the local reference clock. In system 200, received data (data in) is an analog non-return-to-zero (NRZ) signal, which is input to phase detector 20 Phase detector 202 tracks the phase of NRZ data in and generates signals Up and Dn to frequency transformer 203 which in turn generates a response which passes through low pass filter 204 and reaches voltage-controlled oscillator (VCO) 205. The output of VCO 205 is fed back into phase detector 202 to complete loop 207. Loop 207 forms a PLL, which helps align the phase of the local reference clock to that of data in, thus generating a recovered clock at the output of VCO 205. The recovered clock may be buffered by buffer 206 and used by sampler 201 to sample data in to generate the recovered data. System 200 is outdated in its applications as it is configured primarily in the analog domain. Further, while the PLL formed by loop 207 helps in phase alignment, it does not help with synchronizing the frequency of data in with that of the local reference clock. Accordingly, system 200 is not effective in overcoming the aforementioned drawbacks of the frequency offset.

With reference now to FIG. 2B, phase interpolator (PI) based closed loop digital CDR system 210 is illustrated. In system 210, the local reference clock operating at frequency Fref is phase aligned with data in master PLL (MPLL) 218. The reference clock at frequency Fref passes through MPLL 218 and is fed to phase interpolator (P1) 217. PI 217 also receives another input from CDR loop 219 which comprises bang-bang phase detector (!!PD) 214, digital loop filter 214, sigma-delta modulator 215, and decoder 216. In contrast to system 200, bang-bang phase detector 213 generates binary digital outputs Up and Down, which assists in bringing the CDR scheme of system 210 into the digital domain. Using loop CDR 219 (particularly sigma-delta modulator 215 and decoder 216), phase information of the recovered clock is fed to PI 217, whereby PI 217 changes the phase of the recovered clock using phase information along with the reference clock frequency derived from MPLL 218. Received data (data in) is fed through equalizer 211 and the analog data output of equalizer 211 is sampled by sampler 212 using the phase input from PI 217 which enables sampler 212 to sample data in at the correct position and at the correct time. However, if frequency of data in and Fref have a frequency offset, the CDR loop 219 will not be effective. Moreover, if the frequency offset is high, the component blocks of CDR loop 219 will be heavily taxed, thereby leading to performance degradation of system 210.

With reference now to FIG. 2C, a conventional burst mode open loop CDR system 220 is illustrated. System 220 is configured for received data (data in) which may be received in bursts with breaks caused due to events such as channel switches. Local reference clock operating at frequency Fref is input to Phase Frequency Detector (PFD) 221, which outputs Up/Dn signals to frequency transformer (CP) 222. Similar to system 200, frequency tracking block 229 comprises a PLL formed by PFD 221, CP 222, filter 223, shared GVCO 224 and divider 225. Shared GVCO 224 differs from VCO 205 of system 200, in that it includes a gated VCO (GVCO). A GVCO may be configured to gate a VCO, thus enabling control by an edge or level-triggered gating signal. Divider 225 is configured to divide the frequency output of shared GVCO 225 in order to reduce the phase difference by an order N, where N may be a suitably chosen integer or fraction. The clock thus recovered at point 226 from the PLL of frequency tracking block 229 is used to control replica GVCO 227.

In an ideal case, replica GVCO 227 would be designed to be identical to shared GVCO 224, such that the oscillations of replica GVCO 112 may match that of shared GVCO 224 in steady state. However, on-chip fluctuations and process variations may result in minor deviations from this ideal case, causing a frequency offset ΔF2 to appear between oscillation frequencies of shared GVCO 224 and replica GVCO 227. This frequency offset ΔF2 may be in addition to the frequency offset that may already exist between received data (data in) and Fref.

With continuing reference to FIG. 2C, data in is sampled by replica GVCO 227 to generate a recovered clock which controls the clock input of D flip-flop (DFF) 228. Data in which is received as serial data, may then be deserialized by DFF 228 to generate the output, recovered data. However, due to non-idealities noted above, frequency offsets ΔF and ΔF2 may lead to errors and performance degradation of system 220. Further, the jitter tolerance of system 220, which also depends on frequency offsets ΔF and ΔF2, will be correspondingly reduced.

Accordingly, it can be seen that in each of the above-described conventional CDR systems, 200, 210, and 220, the issues related to frequency offsets are insufficiently addressed. Other known techniques attempt to improve the accuracy of the reference clocks using expensive high quality crystal oscillators, which may come at a prohibitively high cost, and yet be insufficient. Some custom designs seeking to incorporate an estimated frequency offset within customized reference clocks in order to compensate for the frequency offset are also known in the art. However, the accuracy of such customized designs severely decreases as the frequency of transmission increases.

Accordingly, there exists a need in the art for CDR systems capable of overcoming the aforementioned problems associated with frequency offsets.

SUMMARY

Exemplary embodiments of the invention are directed to systems and methods for automatic detection and compensation of frequency offset in point-to-point communication.

For example, an exemplary embodiment is directed to a burst mode clock and data recovery (CDR) system comprising: input data received at a first frequency; a reference clock operating at a second frequency; a master phase-locked loop (PLL) comprising a first gated voltage controlled oscillator (GVCO) to align the phases of reference clock and the input data, and provide phase error information and a recovered clock; a second GVCO controlled by the recovered clock to sample the input data; and a frequency alignment loop comprising a feedback path from the second GVCO to the master PLL to use the phase error information to correct a frequency offset between the first frequency and the second frequency.

Another exemplary embodiment is directed to a phase interpolator (PI) based digital clock and data recovery (CDR) system comprising input data received at a first frequency; a reference clock operating at a second frequency; a master phase-locked loop (PLL) to align the phases of reference clock and the input data; a phase interpolator coupled to the output of the master PLL; and a frequency alignment loop comprising a feedback path from the phase interpolator to the master PLL to correct a frequency offset between the first frequency and the second frequency.

Another exemplary embodiment is directed to a clock and data recovery (CDR) system comprising: input data received at a first frequency; a reference clock operating at a second frequency; means for detecting phase error information between the input data and the reference clock; means for detecting a frequency offset between the first frequency and the second frequency using the detected phase error information; and means for eliminating the frequency offset.

Another exemplary embodiment is directed to a method of performing clock and data recovery at a receiver, the method comprising: receiving input data from a transmitter at a first frequency; operating the receiver at a second frequency based on a reference clock integrated in the receiver; detecting phase error information between the input data and the reference clock; detecting a frequency offset between the first frequency and the second frequency using the detected phase error information; and eliminating the frequency offset to synchronize the first frequency and the second frequency.

Another exemplary embodiment is directed to a method of configuring a burst mode clock and data recovery (CDR) system, the method comprising: receiving input data at a first frequency; operating a reference clock at a second frequency; configuring a master phase-locked loop (PLL) comprising a first gated voltage controlled oscillator (GVCO) to align the phases of reference clock and the input data, and provide phase error information and a recovered clock; configuring a second GVCO controlled by the recovered clock to sample the input data; and configuring a frequency alignment loop comprising a feedback path from the second GVCO to the master PLL to use the phase error information to correct a frequency offset between the first frequency and the second frequency.

Another exemplary embodiment is directed to a method of configuring a phase interpolator (PI) based digital clock and data recovery (CDR) system, the method comprising: receiving input data at a first frequency; operating a reference clock at a second frequency; configuring a master phase-locked loop (PLL) to align the phases of reference clock and the input data; coupling a phase interpolator to the output of the master PLL; and configuring a frequency alignment loop comprising a feedback path from the phase interpolator to the master PLL to correct a frequency offset between the first frequency and the second frequency.

BRIEF DESCRIPTION OF THE DRAWINGS

The accompanying drawings are presented to aid in the description of embodiments of the invention and are provided solely for illustration of the embodiments and not limitation thereof.

FIG. 1A illustrates a unidirectional transmitter-receiver system 100.

FIG. 1B illustrates a bidirectional transceiver system 110.

FIG. 2A illustrates a PLL based closed loop analog CDR system 200.

FIG. 2B illustrates a PI based closed loop digital CDR system 210.

FIG. 2C illustrates a burst mode open loop CDR system 220.

DETAILED DESCRIPTION

Figure 3:
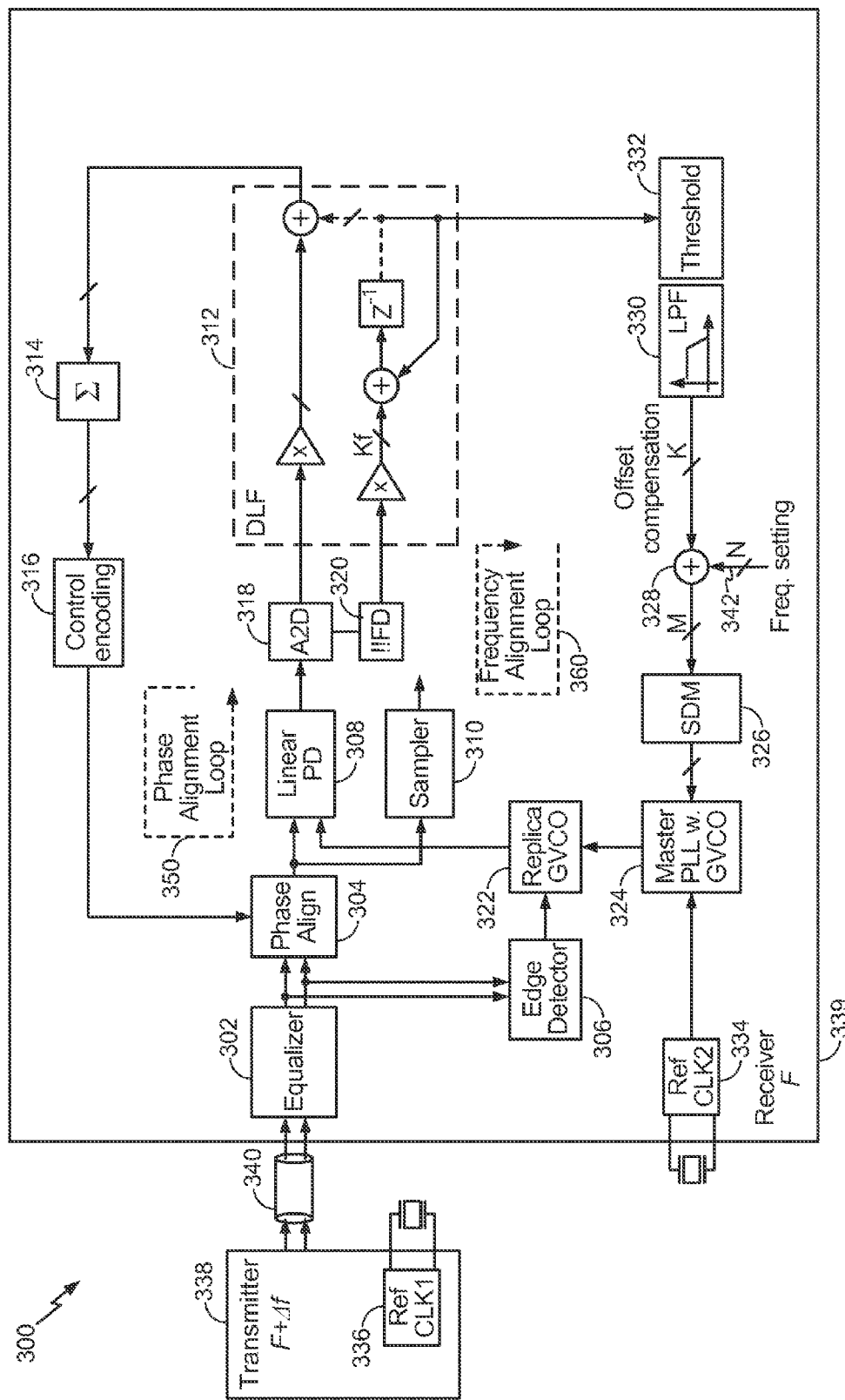
FIG. 3 illustrates a burst mode CDR system 300 which includes a frequency alignment loop configured according to exemplary embodiments.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended, to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action, Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Exemplary embodiments include systems for low cost automatic detection of frequency offset in point-to-point data communication, and accurate and automatic compensation of the frequency offset to minimize errors. Embodiments may be integrated in systems including serializer-deserializer (SerDes) architectures for CDR in receivers, transceivers, etc.

Referring to FIG. 3, burst mode CDR system 300 configured according to exemplary embodiments is illustrated. Before a detailed description of the configuration of system 300 is presented, it will be generally noted that in comparison to conventional burst mode CDR system 220 of FIG. 2C, system 300 includes an additional frequency alignment loop, 360. More specifically, in system 220, there is no loop connection (or there is an open loop) between shared GVCO 224 and replica GVCO 224. On the other hand, in system 300, frequency alignment loop 360 is provided between MPLL block 324 and replica GVCO 322. As will be farther explained below, frequency alignment loop 360 eliminates or substantially reduces frequency offsets such as $\Delta F$ and $\Delta F2$ described above.

With continuing reference to FIG. 3, system 300 may be incorporated in receiver 339 which may receive input data 340 from transmitter 338. Transmitter 338 may operate at a frequency $F + \Delta F$, derived from reference clock 336. Data 340 may first be input to equalizer 302. Equalizer 302 may be configured to amplify high frequency parts of data 340 more than the low frequency parts, in order to compensate for the low-pass behavior of communication channels carrying data 340 between transmitter 338 and receiver 339. The output of equalizer 302 may then be fed into edge detector 306 configured to detect rising/falling edges of data transitions. As shown, the output of equalizer 302 is also fed into phase align block 304, thereby entering phase alignment loop 350.

Phase alignment loop 350 may compensate and correct local phase offset between the phase of the output of equalizer 302 to the data input of sampler 310 and the phase of the clock input to sampler 310. Phase alignment loop 350 may use phase error information to assist the operation of frequency alignment loop 360, in order to correct frequency offsets such as $\Delta F$ between transmitter 338 and receiver 339, as well as $\Delta F2$ due to locally generated frequency mismatches within receiver 339.

It must be noted that phase alignment loop 350 may be enabled to set up initial conditions, and thereafter, in steady state, phase alignment loop 350 may be disabled. As shown, phase alignment loop 350 includes at least phase align block 304, linear phase detector (PD) 308, analog-to-digital (A2D) converter 318, digital loop filter (DLF) 312, integrator $\Sigma$ 314, and control encoding block 316. Additionally, phase alignment loop 350 may also include the branch comprising frequency detector 320 fed into a leg of DLF 312. DLF 312 may comprise adders and integrators as shown, and as are well known in the art and will not be described in detail herein. In the illustrated configuration, the various above-described components of phase alignment loop 350 may form a PLL to align the phase of received data stream 322 with the oscillations of replica GVCO 322 during initial conditions or during transitions such as channel switches. Thereafter, phase alignment loop 350 may not be necessary once the phase alignment is achieved, and phase alignment loop 350 may be disabled or decoupled from frequency alignment loop 360.

Turning now to frequency alignment loop 260, the components therein may be configured to compensate for the frequency offset $\Delta F$ and $\Delta F2$. Reference clock 334 of receiver 339 operating at frequency F may be a local reference clock embedded on the same chip as system 300. This reference clock, 334 may drive the block designated. 324 which may comprise a master PLL (MPLL) which includes a GVCO. In other words, block 324 may comprise similar logic as shown in frequency tracking block 229 of system 220. As previously mentioned, system 300 notably differs from conventional system 200 in that the connection to replica GVCO 322 in system 300 loops back from the output of replica GVCO 322 to feed back into master PLL with GVCO block 324.

Thus, master PLL with G-VCO 224 may control the frequency of replica GVCO 322. However, on account of frequency alignment loop 360, any frequency offset which may exist between master PLL with GVCO 324 and replica GVCO 322 will be automatically compensated for. In other words, frequency alignment loop 360 eliminates or substantially reduces frequency offset $\Delta F2$. Various other illustrated blocks of frequency alignment loop 360 will now be described.

Turning now to sigma-delta modulator (SDM) 326, Sigma-delta ($\Sigma \Delta$) modulation involves converting a high-resolution analog signal input into lower-resolution digital signal output and encoding the digital signal output in binary logic. The conversion may be done using error feedback, wherein a difference between the input and output signals may be used to improve the conversion. The encoded digital signal output may thus provide the division factor (similar to divider 225 of system 220) for the PLL of block 324. The analog signal input to SDM 326 may be available from adder 328 which may combine the output of low pass filter LPF 330 and an external frequency setting control 342. It will be noted that SDM 326 may be a pre-existing block in conventional receiver architectures, and therefore including SDM 326 as shown in exemplary embodiments may not incur added costs in configuring system 300.

With reference now to low pass filter UT 330, LPF 330 may be configured to restrict the range of frequencies in frequency alignment loop 360 to a smaller band. Threshold block 332 may be optionally coupled to LIT 330. Threshold block 332 may restrict the minimum frequency offset $\Delta F$ that will be compensated. In other words, threshold block 332 may define n tolerance level such that a frequency offset value below a predetermined threshold may be ignored, and only frequency offset values which exceed the predetermined threshold will be automatically compensated for in frequency alignment loop 360. One way to control the optional inclusion of threshold block 332 is by controlling the predetermined threshold, such that if the predetermined threshold value is set to "zero" then the threshold block 332 is effectively excluded. Frequency alignment loop 360 may be completed as shown by deriving an input to threshold block 332 front DLF 312. Once again it will be noted that LPF 330 and threshold block 332 may also be pre-existing logic components in conventional receiver architectures, and therefore configuring system 300 in the above-described manner may not incur added costs. In other words, configuring exemplary embodiments with frequency alignment loop 360 may merely involve the minimal overhead associated with reconfiguring or rewiring pre-existing logic blocks in the above-described manner in order to reduce or eliminate frequency offsets.

Accordingly, the combined, effect of the above-described phase alignment loop 350 and frequency alignment loop 360 is to compensate and eliminate both types of frequency offsets $\Delta F$ and $\Delta F2$ which are seen to hinder conventional CDR systems 200, 210, and 220. The described embodiments may be appropriately configured to tune the various blocks and set related oscillation frequencies during a calibration stage of system 300, as well as during normal operating modes.

Figure 4:
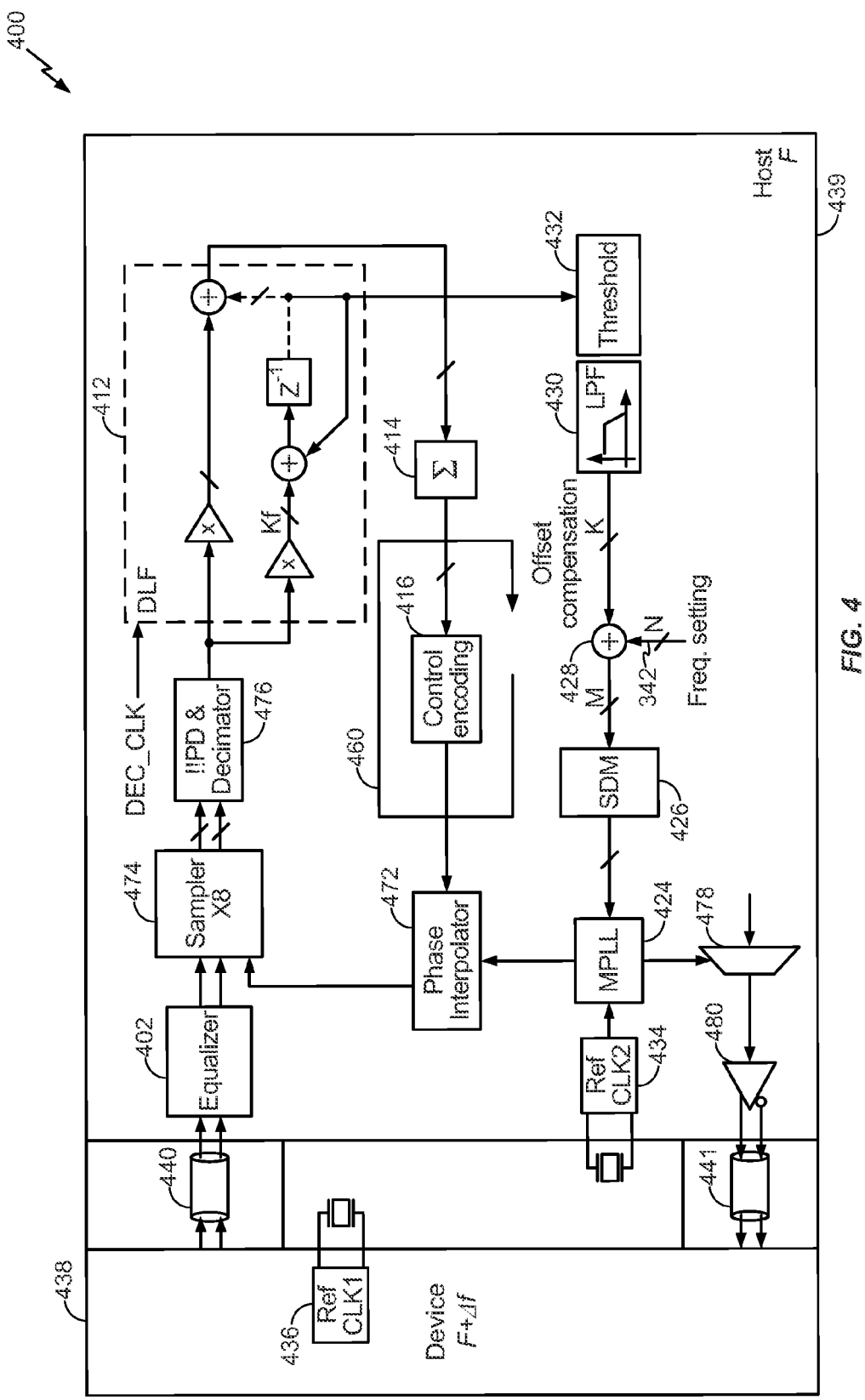
FIG. 4 illustrates a PI based digital CDR system 400 which includes a frequency alignment loop configured according to exemplary embodiments.

Referring now to FIG. 4, another exemplary embodiment with frequency alignment loop as above, configured in PI based, digital CDR system 400 is illustrated. It will be recognized that system 400 may be configured by adding frequency alignment loop 460 to a conventional PI based digital CDR system such as system 210 of FIG. 2B. As shown, system 400 may be embedded in a transceiver or host 439 operating at a frequency F derived from reference clock 434. Data 440 may be received from a transmitter or any device 438 operating at a reference frequency $F+\Delta F$ derived from reference clock 436. Further, system 400 may also be configured to eliminate or substantially reduce any frequency offsets related to data 441 transmitted in the reverse direction from host 439 to device 438 using multiplexer 378 and driver 380, thus extended the techniques therein without loss of generality to any bidirectional communication system.

In general, system 400 may be configured by adding frequency alignment loop 460 to conventional system 210, in a similar manner as described above with reference to configuring system 300 from conventional system 220 by adding frequency alignment loop 260. In more detail, system 400 may comprise phase alignment loop 450 and frequency alignment loop 460.

Phase alignment loop 450 may derive an input from equalizer 402 which receives data 440. An output of equalizer 402 may pass through sampler x8 474 which may selectively sample the data stream output generated by equalizer 474. The output of sampler x8 474 may traverse !!PD and decimator 476, DLF 412, integrator block $\Sigma$ 414, control encoding block 416 and phase interpolator 472 to complete phase alignment loop 450. In light of the explanation provided previously with regard to loop 219 of system 210 and the capability of one of ordinary skill in the art, further details of phase alignment loop 450 will be sacrificed for the sake of brevity.

Coming now to frequency alignment loop 460, the output of DLF 412 passes through threshold block 432 and low pass filter LPF 430. The output of LPF 430 combined with an external frequency setting control 442 may be combined in adder 428 and the output thereof may be fed into SDM 426 as an analog input signal. The output of SDM 426, a binary encoded digital signal may constitute a division factor for MPLL 424 which may set the oscillation frequency for system 400. Once again, given the similarities in frequency alignment loop 360 of previously discussed system 300 and frequency alignment loop 460 of system 400, further explanation will be avoided herein for the sake of brevity. While in system 220, MPLL 218 and PI 217 lack a closed loop connection, frequency alignment loop 460 in system 400 provides such a loop from phase interpolator 472 back to MPLL 424, thus eliminating or substantially reducing corresponding frequency offsets.

Figure 5:
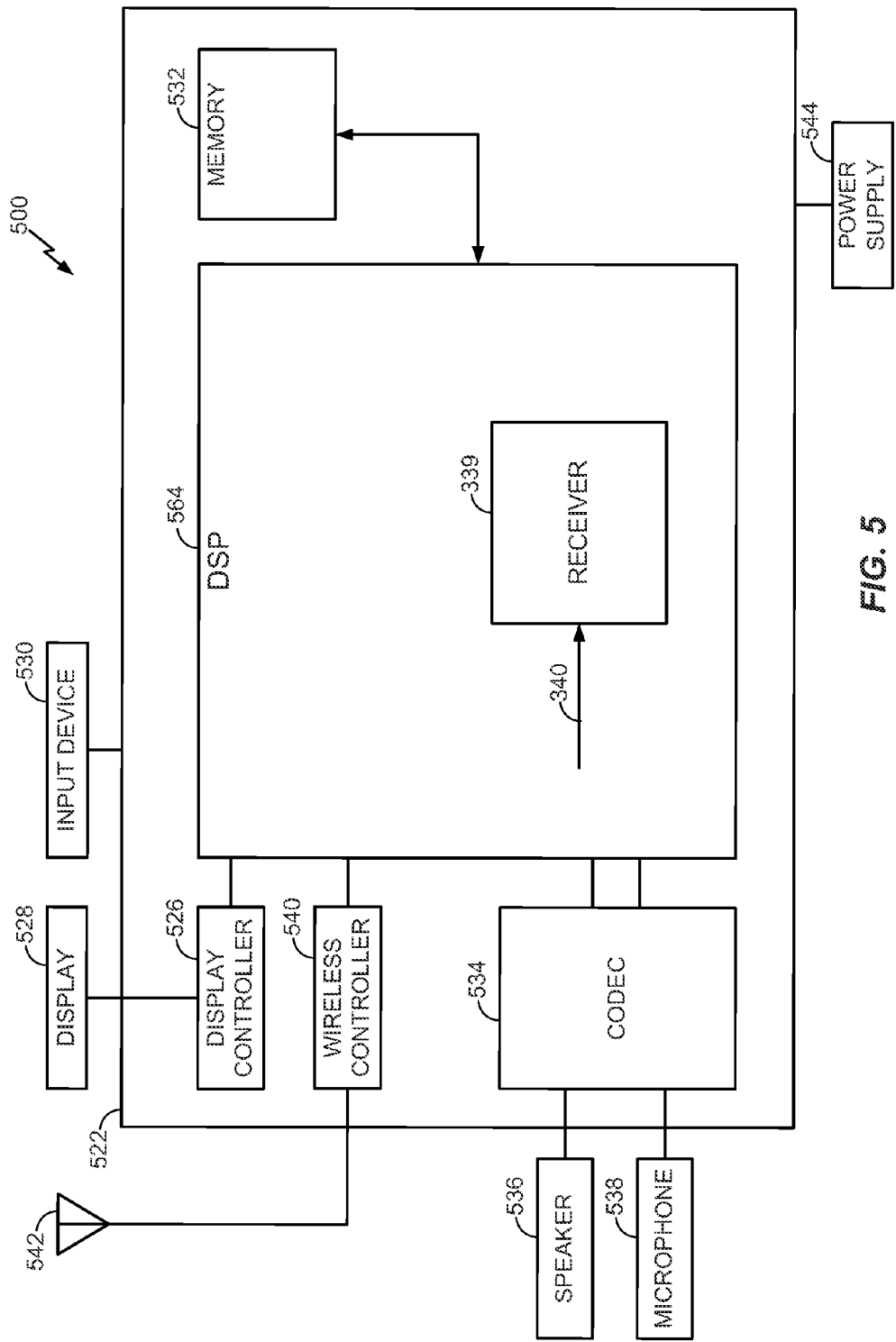
FIG. 5 illustrates an exemplary wireless communication system 500 in which an embodiment of the disclosure may be advantageously employed.

Referring to FIG. 5, a block diagram of a particular illustrative embodiment of a wireless device that includes a multi-core processor configured according to exemplary embodiments is depicted and generally designated 500. The device 500 includes a digital signal processor (DSP) 564, which may include receiver 339 of FIG. 3, wherein receiver 339 may receive input data 340 from any of the devices/components coupled to DSP 564 as shown and further described, below. DSP 564 is coupled to memory 532. FIG. 5 also shows display controller 526 that is coupled to DSP 564 and to display 528. Coder/decoder (CODEC) 534 (e.g., an audio and/or voice CODEC) can be coupled to DSP 564. Other components, such as wireless controller 540 (which may include a modem) are also illustrated. Speaker 536 and microphone 538 can be coupled to CODEC 534. FIG. 5 also indicates that wireless controller 540 can be coupled to wireless antenna 542. In a particular embodiment, DSP 564, display controller 526, memory 532, CODEC 534, and wireless controller 540 are included in a system-in-package or system-on-chip device 522.

In a particular embodiment, input device 530 and power supply 544 are coupled to the system-on-chip device 522. Moreover, in a particular embodiment, as illustrated in FIG. 5, display 528, input device 530, speaker 536, microphone 538, wireless antenna 542, and power supply 544 are external to the system-on-chip device 522. However, each of display 528, input device 530, speaker 536, microphone 538, wireless antenna 542, and power supply 544 can be coupled to a component of the system-on-chip device 522, such as an interface or a controller.

It should be noted that although FIG. 5 depicts a wireless communications device, DSP 564 and memory 532 may also be integrated into a set-top box, a music player, a video player, an entertainment unit, a navigation device, a personal digital assistant (PDA), a fixed location data unit, or a computer. A processor (e.g., DSP 564) may also be integrated into such a device.

Accordingly, an embodiment of the invention can include a computer readable media embodying a method for automatically detecting and correcting frequency offset in a CDR system. Accordingly, the invention is not limited to illustrated examples and any means for performing the functionality described herein are included in embodiments of the invention.

Figure 6:
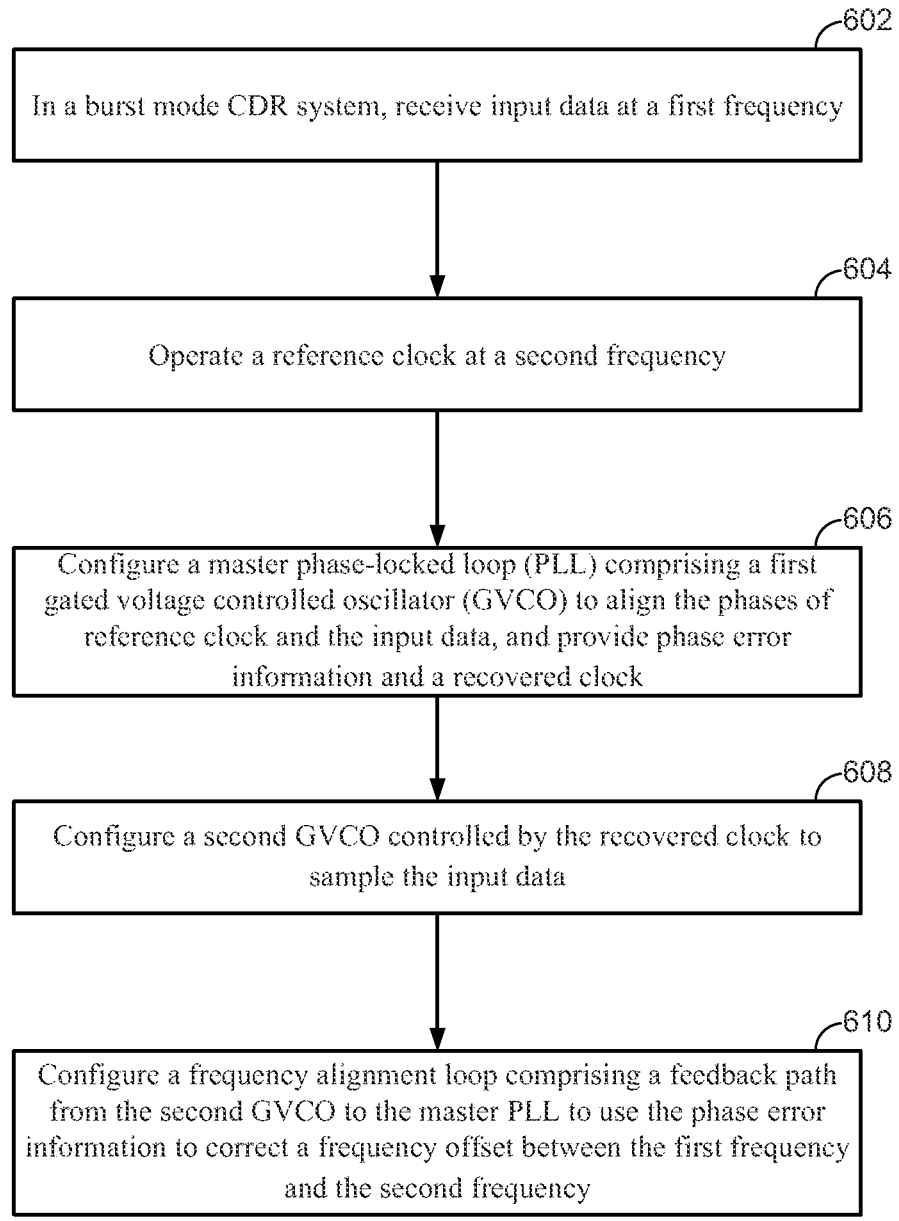
FIG. 6 is a flow chart illustrating the operational flow of configuring a burst mode clock and data recovery (CDR) system according to exemplary embodiments.

Further, it will be appreciated that embodiments include various methods for performing the processes, functions and/or algorithms disclosed herein. For example, as illustrated in FIG. 6, an embodiment can include a method of configuring a burst mode clock and data recovery (CDR) system, the method comprising: receiving input data (e.g. 340) at a first frequency (e.g. F+γF)—Block 602; operating a reference clock (e.g. 334) at a second frequency (e.g. F)—Block 604; configuring a master phase-locked loop (PLL) comprising a first gated voltage controlled oscillator (GVCO) (e.g. 334) to align the phases of reference clock and the input data, and provide phase error information and a recovered clock (output of 334)—Block 606; configuring a second GVCO (e.g. 322) controlled by the recovered clock to sample (e.g. using 310) the input data—Block 608; and configuring a frequency alignment loop (e.g. 360) comprising a feedback path from the second GVCO to the master PLL to use the phase error information to correct a frequency offset between the first frequency and the second frequency—Block 610.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A burst mode clock and data recovery (CDR) system comprising:
   input data received at a first frequency;
   a reference clock operating at a second frequency;
   a master phase-locked loop (PLL) comprising a first gated voltage controlled oscillator (GVCO) to align the phases of reference clock and the input data, and provide phase error information and a recovered clock;
   a second GVCO controlled by the recovered clock to sample the input data; and
   a frequency alignment loop comprising a feedback path from the second GVCO to the master PLL configured to use the phase error information to compensate for a frequency offset between the first frequency and the second frequency.

2. The burst mode CDR system of claim 1, wherein the feedback path comprises:
   a linear phase detector coupled to an output of the second GVCO;
   an analog-to-digital converter coupled to an output of the linear phase detector;
   a digital loop filter coupled to an output of the analog-to-digital converter;
   a threshold block coupled to an output of the digital loop filter;
   a low pass filter coupled to an output of the threshold block;
   an input of an adder coupled to an output of the low pass filter; and
   a sigma-delta modulator coupled to an output of the adder, wherein an output of the sigma delta modulator is coupled to the master PLL.

3. The burst mode CDR system of claim 1, further comprising a phase alignment loop to align the phase of the output of the second GVCO with the input data, the phase alignment loop comprising:
   a phase alignment block coupled to the input data;
   a linear phase detector coupled to an output of the phase alignment block and the output of the second GVCO;
   the analog-to-digital converter coupled to the output of the linear phase detector;
   the digital loop filter coupled to the output of the analog-to-digital converter;
   an integrator coupled to the output of the digital loop filter; and
   a control encoding block coupled to an output of the integrator, wherein an output of the control encoding block is coupled to the phase alignment block.

4. The burst mode CDR system of claim 3, wherein the input data is coupled to the phase alignment block through an equalizer.

5. The burst mode CDR system of claim 4, further comprising an edge detector coupled to an output of the equalizer, wherein an output of the edge detector is coupled to the second GVCO.

6. The burst mode CDR system of claim 1 integrated in a receiver, wherein the input data is transmitted by a transmitter.

7. The burst mode CDR system of claim 1 integrated in a semiconductor die.

8. The burst mode CDR system of claim 1, integrated into a device, selected from the group consisting of a set top box, music player, video player, entertainment unit, navigation device, communications device, personal digital assistant (PDA), fixed location data unit, and a computer.

9. A phase interpolator (PI) based digital clock and data recovery (CDR) system comprising:
- input data received at a first frequency;
- a reference clock operating at a second frequency;
- a master phase-locked loop (PLL) to align the phases of reference clock and the input data;
- a phase interpolator coupled to the output of the master PLL; and
- a frequency alignment loop comprising a feedback path from the phase interpolator to the master PLL to compensate for a frequency offset between the first frequency and the second frequency, wherein the feedback path comprises:
- a sampler coupled to an output of the phase interpolator;
- a bang-bang phase detector and decimator coupled to an output of the sampler;
- a filter coupled to an output of the bang-bang phase detector and decimator;
- a threshold block coupled to an output of the filter;
- a low pass filter coupled to an output of the threshold block;
- an input of an adder coupled to an output of the low pass filter; and
- a sigma-delta modulator coupled to an output of the adder, wherein an output of the sigma delta modulator is coupled to the master PLL.

10. The PI based digital CDR system of claim 9, further comprising an equalizer coupled to the input data, wherein an output of the equalizer is coupled to the sampler.

11. The burst mode CDR system of claim 9 integrated in a receiver, wherein the input data is transmitted by a transmitter.

12. The burst mode CDR system of claim 9 integrated in a semiconductor die.

13. The burst mode CDR system of claim 9, integrated into a device, selected from the group consisting of a set top box, music player, video player, entertainment unit, navigation device, communications device, personal digital assistant (PDA), fixed location data unit, and a computer.

14. A method of configuring a burst mode clock and data recovery (CDR) system, the method comprising:
- receiving input data at a first frequency;
- operating a reference clock at a second frequency;
- configuring a master phase-locked loop (PLL) comprising a first gated voltage controlled oscillator (GVCO) to align the phases of reference clock and the input data, and provide phase error information and a recovered clock;
- configuring a second GVCO controlled by the recovered clock to sample the input data; and
- configuring a frequency alignment loop comprising a feedback path from the second GVCO to the master PLL to use the phase error information to compensate for a frequency offset between the first frequency and the second frequency.

15. The method of claim 14, wherein forming the feedback path comprises:
- coupling a linear phase detector to an output of the second GVCO;
- coupling an analog-to-digital converter to an output of the linear phase detector;
- coupling a digital loop filter to an output of the analog-to-digital converter;
- coupling a threshold block to an output of the digital loop filter;
- coupling a low pass filter to an output of the threshold block;
- coupling an input of an adder to an output of the low pass filter;
- coupling a sigma-delta modulator to an output of the adder; and
- coupling an output of the sigma delta modulator to the master PLL.

16. The method of claim 14, further comprising configuring a phase alignment loop to align the phase of the output of the second GVCO with the input data, wherein configuring the phase alignment loop comprises:
- coupling a phase alignment block to the input data;
- coupling a linear phase detector to an output of the phase alignment block and the output of the second GVCO;
- coupling the analog-to-digital converter to the output of the linear phase detector;
- coupling the digital loop filter to the output of the analog-to-digital converter;
- coupling an integrator to the output of the digital loop filter;
- coupling a control encoding block coupled to an output of the integrator; and coupling an output of the control encoding block to the phase alignment block.

17. The method of claim 16, further comprising coupling the input data to the phase alignment block through an equalizer.

18. The method of claim 17, further comprising:
- coupling an edge detector to an output of the equalizer, and
- coupling an output of the edge detector to the second GVCO.

19. A method of configuring a phase interpolator (PI) based digital clock and data recovery (CDR) system, the method comprising:
- receiving input data at a first frequency;
- operating a reference clock at a second frequency;
- configuring a master phase-locked loop (PLL) to align the phases of reference clock and the input data;
- coupling a phase interpolator to the output of the master PLL; and
- configuring a frequency alignment loop comprising a feedback path from the phase interpolator to the master PLL to compensate for a frequency offset between the first frequency and the second frequency, wherein forming the feedback path comprises:
- coupling a sampler to an output of the phase interpolator;
- coupling a bang-bang phase detector and decimator to an output of the sampler;
- coupling a filter to an output of the bang-bang phase detector and decimator;
- coupling a threshold block to an output of the filter;
- coupling a low pass filter to an output of the threshold block;
- coupling an input of an adder to an output of the low pass filter;
- coupling a sigma-delta modulator to an output of the adder; and
- coupling an output of the sigma delta modulator to the master PLL.

20. The method of claim 19, further comprising:
coupling an input of an equalizer to the input data; and
coupling an output of the equalizer to the sampler.

* * * * *